(12) United States Patent
Hachino et al.

(10) Patent No.: US 7,345,908 B2
(45) Date of Patent: Mar. 18, 2008

(54) MEMORY DEVICE

(75) Inventors: Hidenari Hachino, Nagasaki (JP);
Nobumichi Okazaki, Kanagawa (JP);
Katsuhisa Aratani, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/456,436

(22) Filed: Jul. 10, 2006

(65) Prior Publication Data
US 2007/0012959 A1    Jan. 18, 2007

(30) Foreign Application Priority Data
Jul. 13, 2005    (JP) .......................... P2005-203947

(51) Int. Cl.
*G11C 11/00* (2006.01)
(52) U.S. Cl. ............ 365/148; 365/185.11; 365/230.03
(58) Field of Classification Search ............... 365/148, 365/230.03, 185.11
See application file for complete search history.

(56) References Cited

U.S. PATENT DOCUMENTS 5,761,115 A    6/1998 Kozicki et al.

6,798,685 B2 * 9/2004 Rinerson et al. ............ 365/100
2004/0161888 A1 * 8/2004 Rinerson et al. ............ 438/210

FOREIGN PATENT DOCUMENTS

JP    2002-536840    10/2002

OTHER PUBLICATIONS

W. W. Zhuang et al.; Novell Colossal Magnetoresistive Thin Film Nonvolatile Resistance Random Access Memory (RRAM); Technical Digest IEDM; p. 193; 2002.
A. Beck et al.; Reproductive witching effect in thin oxide films for memory applications; Applied Physics Letters; 2000; vol. 77; p. 139-141.

* cited by examiner

*Primary Examiner*—Thong Q. Le
(74) *Attorney, Agent, or Firm*—Sonnenschein Nath & Rosenthal LLP

(57) ABSTRACT

The present invention is to provide a memory device including: a plurality of memory cells that each include a memory element having a memory layer and first and second electrodes that sandwich the memory layer, the plurality of memory cells being divided into memory blocks of m columns by n rows (m and n are each an integer of not less than 1, m+n≧3), the memory elements in the same memory block having the first electrode that is formed of a single layer in common to the memory elements; and a voltage application unit that applies any voltage to the first electrode of the memory block.

4 Claims, 7 Drawing Sheets

MEMORY DEVICE

CROSS REFERENCES TO RELATED APPLICATIONS

The present invention contains subject matter related to Japanese Patent Application JP 2005-203947 filed in the Japanese Patent Office on Jul. 13, 2005, the entire contents of which being incorporated herein by reference.

BACKGROUND OF THE INVENTION

1. Field of the Invention

The present invention relates to a memory device. More specifically, the invention relates to a memory device that includes memory cells each employing a memory element for storing and holding information based on its electric resistance state.

2. Description of the Related Art

In information apparatuses such as computers, high-speed and high-density DRAMs (Dynamic Random Access Memories) are widely used as a random access memory.

However, the DRAM is a volatile memory and therefore loses information when power is cut off. Accordingly, the need for nonvolatile memories, which do not involve the information loss, is increasing.

As nonvolatile memories that are considered to be promising in the future, FeRAMs (ferroelectric memories), MRAMs (magnetic memories), phase-change memories, and resistance variable memories such as programmable metallization cells (PMCs) and RRAMs have been proposed.

These memories can hold written information for a long period without supply of power thereto. In addition, these memories need no refresh operation since they are nonvolatile, and therefore would achieve correspondingly reduced power consumption.

The resistance variable nonvolatile memories such as the PMCs and RRAMs employ, as the memory layer for storing and holding information, a material having a characteristic that its resistance value changes in response to application of voltage or current thereto. Furthermore, these memories have a comparatively simple configuration in which a memory layer is sandwiched between two electrodes and voltage or current is applied to these two electrodes. This simple configuration allows the size of memory elements therein to be decreased easily.

The PMC has a structure in which an ionic conductor containing a certain metal is sandwiched between two electrodes, and the metal contained in the ionic conductor is included in either one of the two electrodes. Thus, the electric property, such as the resistance or capacitance, of the ionic conductor changes when voltage is applied between the two electrodes. The PMC utilizes this characteristic.

Specifically, the ionic conductor is composed of a solid solution of a chalcogenide and a metal (e.g., amorphous GeS or amorphous GeSe), and either one of the two electrodes contains Ag, Cu or Zn (refer to e.g. JP-A-2002-536840, which will be referred to as a first patent document).

As one RRAM, a configuration has been introduced in which a polycrystalline $PrCaMnO_3$ thin film is sandwiched between two electrodes, and application of a voltage pulse or current pulse to the two electrodes greatly varies the resistance of the $PrCaMnO_3$ film as the recording film (refer to e.g. W. W. Zhuang et al., Novel Colossal Magnetoresistive Thin Film Nonvolatile Resistance Random Access Memory (RRAM), Technical Digest "International Electron Devices Meeting", 2002, p. 193, which will be referred to as a first non-patent document). In this RRAM, the polarity of the voltage pulse applied for information recording (writing) is opposite to that of the voltage pulse applied for information erasing.

As another RRAM, a configuration has been introduced in which $SrZrO_3$ (monocrystalline or polycrystalline) doped with a trace of Cr is sandwiched between two electrodes, and applying current from these electrodes varies the resistance of the recording film (refer to e.g. A. Beck et al., Reproducible switching effect in thin oxide films for memory applications, Applied Physics Letters, 2000, vol. 77, pp. 139 to 141, which will be referred to as a second non-patent document).

This second non-patent document shows the I-V characteristic of the memory layer, and according to this, the threshold voltages of recording and erasing are ±0.5 V. According to the second non-patent document, this configuration also allows information recording and erasing through application of a voltage pulse, and the requisite pulse voltage and pulse width are ±1.1 V and 2 ms, respectively. In addition, it is reported that recording and erasing at a higher speed is also possible: operation with a voltage pulse width of 100 ns is possible, and in this case, the requisite pulse voltage is ±5 V.

The present problems of the above-described nonvolatile memories are as follows. In the FeRAMs, it is difficult to carry out non-destructive reading, which enforces implementation of destructive reading and thus leads to a slow reading speed. Furthermore, there is a limitation on the number of times of polarity inversion associated with reading and recording, which limits the number of times of rewriting.

The MRAMs need a magnetic field for recording, and the generation of the magnetic field is attributed to current applied to interconnects. Therefore, a large current amount is needed for recording.

The phase-change memories are memories that implement recording in response to application of voltage pulses with the same polarity and different voltage levels. However, switching of the phase-change memories possibly occurs depending on the temperature, and hence the phase-change memories are problematically sensitive to changes of the environmental temperature.

In the PMC described in the first patent document, the crystallization temperature of the amorphous GeS or amorphous GeSe is about 200° C., and the crystallization of the ionic conductor deteriorates the properties. Therefore, the PMC involves a problem of having insufficient ability to endure high temperatures in steps for fabricating an actual memory element, such as forming steps for a CVD insulating film and a protective film.

The materials of the memory layers proposed for the RRAMs in the first and second non-patent documents are both a crystalline material, which involves the following problems: heat treatment at about 600° C. is necessary; it is extremely difficult to fabricate a single crystal of the proposed materials; and use of a polycrystal makes it difficult to reduce the size of the element because of influence of grain boundaries in the polycrystal.

It is proposed in the above-described documents of the RRAMs that information recording and erasing are implemented through application of a pulse voltage. However, in the proposed configurations, the resistance of the memory layer after recording is different depending on the pulse width of the applied pulse voltage. This dependency of the resistance after recoding on the pulse width indirectly indicates that repetition of application of the same pulse also changes the resistance value.

For example, the first non-patent document reports that, in application of a pulse of the same polarity, the resistance value after recording greatly changes depending on the pulse width of the applied pulse. When the pulse width is as small as 50 ns or less, the rate of a resistance change associated with recording is small. When the pulse width is as large as 100 ns or more, the resistance value has a characteristic that the resistance is not saturated at a certain value but approaches the resistance value before the recording as the pulse width becomes larger. The first non-patent document explains the properties of a memory structure in which a memory layer and a MOS transistor for access control are connected in series to each other to construct a cell, and the cells are arranged in an array. In the explanation of the properties, it is reported that when the pulse width is changed in the range from 10 ns to 100 ns, the resistance value of the memory layer after recording varies depending on the pulse width. It is expected from the characteristic of the memory layer that if the pulse width is further increased and surpasses a certain value, the resistance starts to decrease again.

Specifically, in the RRAM, the resistance value after recording depends on the magnitude of the pulse voltage and the pulse width, and therefore the existence of variation in the magnitude of the pulse voltage and the pulse width results in variation in the resistance value after recording.

Accordingly, if the width of the pulse voltage is shorter than about 100 ns, the rate of a resistance change associated with recording is small, which leads to increased susceptibility to influence of variation in the resistance value after recording, and hence results in difficulty in stable recording.

Therefore, when such a short pulse voltage is used for recording, it is necessary to carry out a process of verifying the contents of information after the recording in order to surely implement recording.

For example, before recording, a process of retrieving and verifying the contents of information that have been recorded in the memory elements (the resistance values of the memory layers) is carried out, and then the recording is implemented in accordance with the relationship between the verified contents (resistance values) and the contents (resistance values) to be recorded. Alternatively, after recording, a process of retrieving and verifying the contents of information recorded in the memory elements is carried out. If the verified resistance values are different from desired resistance values, recording is implemented again to correct the resistances to the desired values.

These procedures including a verifying process lead to a long time period for recording, and hence involve difficulty in overwriting of data at a high speed for example.

In order to solve the above-described problems, a memory device having the following configuration has been proposed (refer to e.g. Japanese Patent Application No. 2004-22121, which will be referred to as a second patent document). Specifically, the memory device includes memory cells that each are formed of a resistance variable memory element (hereinafter, referred to simply as a memory element) and a circuit element connected in series to the memory element. The memory element has a characteristic that its resistance value changes in response to application of a voltage equal to or higher than a threshold voltage to the both ends thereof. When the voltage applied between the both ends of the memory element and circuit element is equal to or higher than a certain voltage that is higher than the threshold voltage, the combined resistance of the memory element and circuit element in the memory cell after transition of the memory element from a high resistance state to a low resistance state becomes an almost constant value irrespective of the magnitude of the voltage. This memory device in the second patent document achieves stable recording and shortening of the time period for information recording.

In one kind of a memory array, memory cells each formed of a memory element and a circuit element (e.g. a MOS transistor) are arranged in a matrix, with one end of the memory element being connected to one end of the MOS transistor in each cell. In the memory array, the gates of the MOS transistors are connected to word lines W provided along the row direction, and the other ends of the MOS transistors are connected to bit lines B provided in the column direction. Such a memory array can be roughly categorized into the following two types depending on the configuration of source lines S connected to the other ends of the memory elements: (1) a memory array in which the source lines and bit lines are parallel to each other (hereinafter, referred to as a bit-source-parallel memory array), and (2) a memory array in which the source lines and bit lines are perpendicular to each other (hereinafter, referred to as a bit-source-perpendicular memory array).

The respective memory arrays will be described below.

In the following description, the operation of changing the state of a memory element from a high resistance state to a low resistance state is defined as writing, and vice versa as erasing. Furthermore, writing under the condition that the bit line potential is higher than the source line potential is defined as writing of data 0, while writing under the condition that the bit line potential is lower than the source line potential is defined as writing of data 1.

Figure 6:
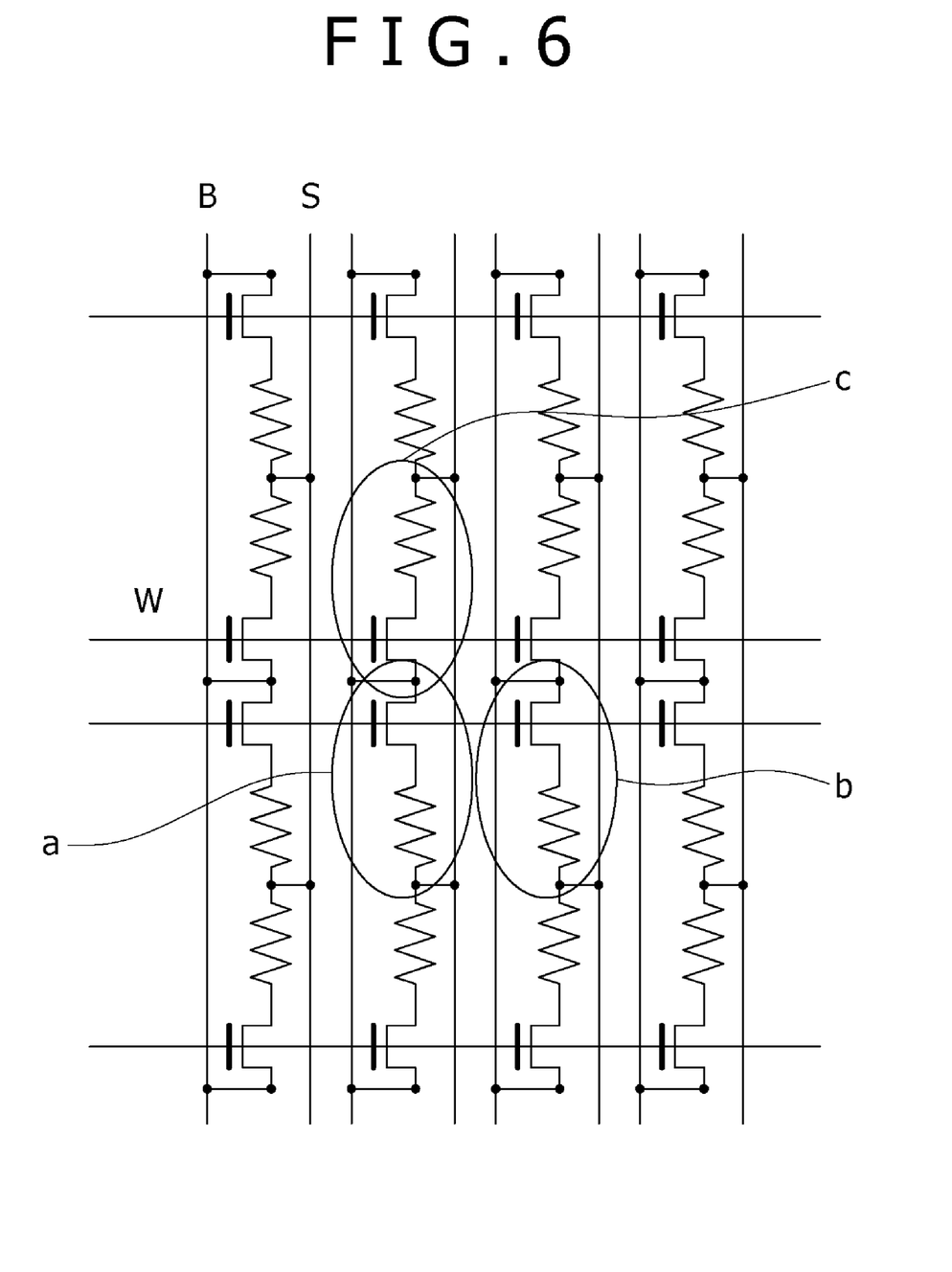
FIG. 6 is a schematic diagram for explaining writing for a bit-source-parallel memory array.

(1) Bit-Source-Parallel Memory Array (see FIG. 6)

When writing is carried out for, of the memory cells in a bit-source-parallel memory array, the memory cell indicated by symbol a in FIG. 6 (writing-target memory cell), the following operation is implemented. Specifically, when data 0 is written, the word line connected to the writing-target memory cell (selected word line) is turned to the high level (hereinafter, the H level), and a potential VDD is applied to the bit line connected to the writing-target memory cell (selected bit line) while 0 V is applied to the source line connected to the writing-target memory cell (selected source line). In contrast, when data 1 is written, the selected word line is turned to the H level, and the selected bit and source lines are provided with 0 V and VDD, respectively. The word, bit and source lines that are not connected to the writing-target memory cell (non-selected word, bit and source lines) are provided with 0 V.

At the time of the writing to the writing-target memory cell, as for the memory cell indicated by symbol b in FIG. 6, which is on the same row as the writing-target memory cell, the potential difference between the bit and source lines is 0 V, and hence writing thereto is not carried out although it is connected to the selected word line. In addition, writing is not carried out for the memory cell indicated by symbol c in FIG. 6, which is on the same column as the writing-target memory cell, since it is not connected to the selected word line.

The writing operation of the bit-source-parallel memory array is simple as described above. However, the bit-source-parallel memory array involves the need to arrange two vertical lines of the bit and source lines in each unit memory cell, which leads to an increased memory cell area.

Figure 7:
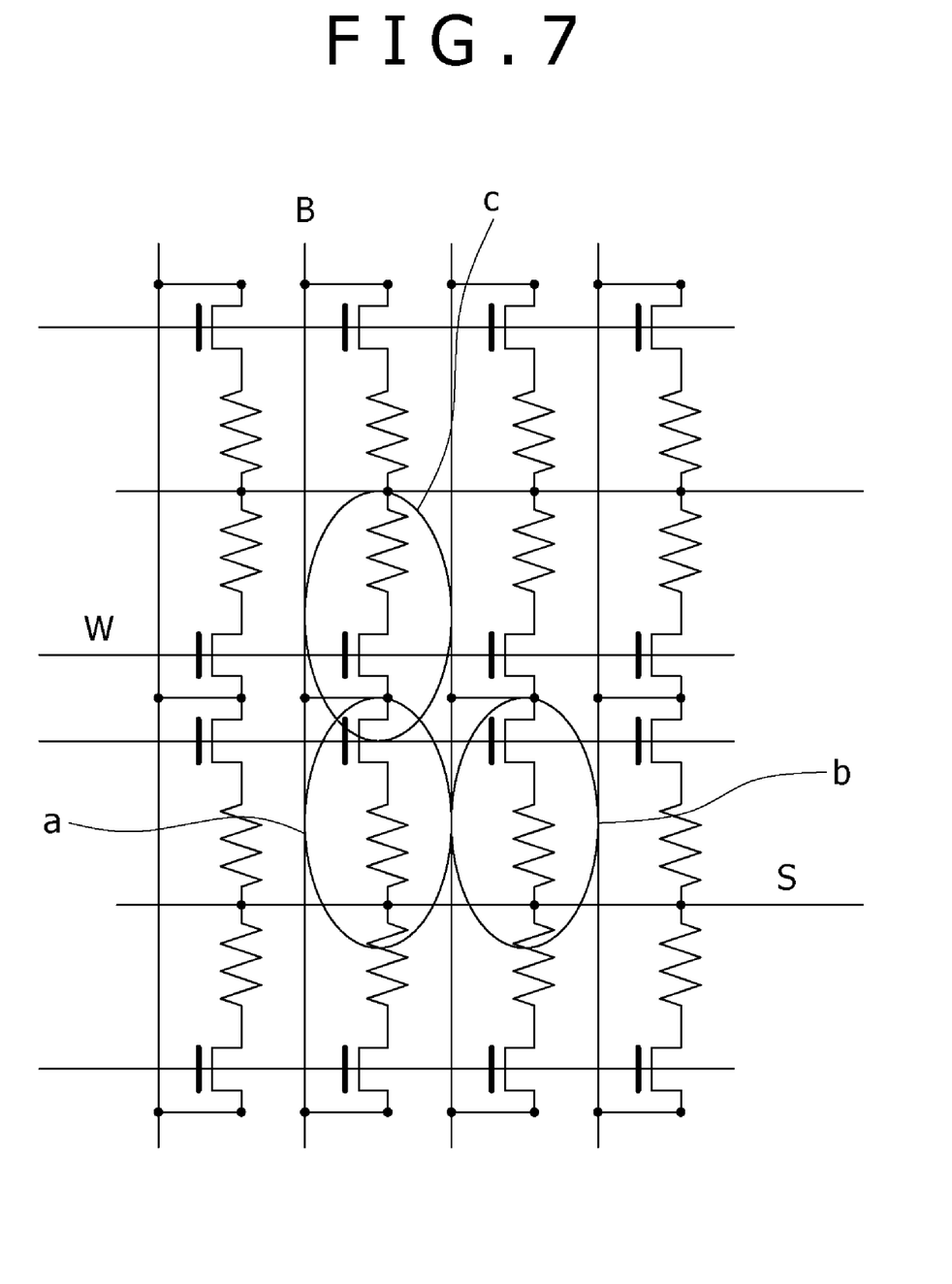
FIG. 7 is a schematic diagram for explaining writing for a bit-source-perpendicular memory array.

(2) Bit-Source-Perpendicular Memory Array (see FIG. 7)

When writing is carried out for memory cells in a bit-source-perpendicular memory array, the following three writing methods are available: (2-1) a source line drive method, (2-2) an intermediate potential settlement method (2-3), and (2-3) a collective erasing method. The respective writing methods will be described below.

(2-1) Source Line Drive Method

When writing is carried out by the source line drive method for, of the memory cells in a bit-source-perpendicular memory array, the writing-target memory cell indicated by symbol a in FIG. 7, the following operation is implemented. Specifically, when data 0 is written, the selected word line is turned to the H level, and VDD and 0 V are applied to the selected bit and source lines, respectively. In contrast, when data 1 is written, the selected word line is turned to the H level, and 0 V and VDD are applied to the selected bit and source lines, respectively. In addition, the non-selected bit lines are provided with VDD. In both of writing of data 0 and 1, the non-selected word and source lines are provided with 0 V. In writing of data 0, the non-selected bit lines are provided with 0 V.

At the time of the writing to the writing-target memory cell, as for the memory cell indicated by symbol b in FIG. 7, which is on the same row as the writing-target memory cell, the potential difference between the bit and source lines is 0 V, and hence writing thereto is not carried out although it is connected to the selected word line. In addition, writing is not carried out for the memory cell indicated by symbol c in FIG. 7, which is on the same column as the writing-target memory cell, since it is not connected to the selected word line.

The bit-source-perpendicular memory array includes the bit and source lines perpendicular to each other, and therefore is allowed to have a reduced memory cell area compared with the bit-source-parallel memory array.

However, if the source line drive method is used for the bit-source-perpendicular memory array, in writing of data 1, VDD needs to be applied to the non-selected bit lines in linkage with application of VDD to the selected source line, which results in increased power consumption. In addition, when writing of both data 0 and data 1 is carried out for the memory cells on the same row, both 0 V and VDD need to be applied to the selected source line, i.e., the source line potential needs to be set twice: to 0 V and VDD, which needs two cycles.

(2-2) Intermediate Potential Settlement Method

When writing is carried out by the intermediate potential settlement method for, of the memory cells in a bit-source-perpendicular memory array, the writing-target memory cell indicated by symbol a in FIG. 7, the following operation is implemented. Specifically, when data 0 is written, the selected word line is turned to the H level, and VDD is applied to the selected bit line while an intermediate potential between 0 V and VDD (e.g., VDD/2) is applied to the selected source line. In contrast, when data 1 is written, the selected word line is turned to the H level, and 0 V is applied to the selected bit line while the intermediate potential between 0 V and VDD (e.g., VDD/2) is applied to the selected source line. The non-selected word lines are provided with 0 V, while the non-selected bit and source lines are provided with the intermediate potential between 0 V and VDD (e.g., VDD/2).

At the time of the writing to the writing-target memory cell, as for the memory cell indicated by symbol b in FIG. 7, which is on the same row as the writing-target memory cell, the potential difference between the bit and source lines is 0 V, and hence writing thereto is not carried out although it is connected to the selected word line. In addition, writing is not carried out for the memory cell indicated by symbol c in FIG. 7, which is on the same column as the writing-target memory cell, since it is not connected to the selected word line.

Also as described above, the bit-source-perpendicular memory array includes the bit and source lines perpendicular to each other, and therefore is allowed to have a reduced memory cell area compared with the bit-source-parallel memory array. Furthermore, employing the intermediate potential settlement method for the bit-source-perpendicular memory array offers simplified writing operation.

However, in this method, the difference of the potentials applied to the selected bit and source lines is VDD/2, which is smaller than that in the above-described source line drive method and the collective erasing method to be described below.

(2-3) Collective Erasing Method

In the collective erasing method, initially first writing is carried out for all memory cells in advance (for example, VDD is applied to all the bit lines collectively or sequentially with all the source lines being provided with 0 V so that data 0 is written to all the memory cells). Subsequently, second writing that is the opposite data writing to the first writing is carried out in accordance with input data (the selected bit lines are set to 0 V in accordance with the input data with the selected source line being provided with VDD so that data 1 is written).

Also as described above, the bit-source-perpendicular memory array includes the bit and source lines perpendicular to each other, and therefore is allowed to have a reduced memory cell area compared with the bit-source-parallel memory array. In addition, when the collective easing method is used for the bit-source-perpendicular memory array, the potential applied to the source lines is not frequently changed unlike the source line drive method, and therefore high-speed operation is allowed with low power consumption. Furthermore, the difference between the potentials applied to the selected bit and source lines is VDD.

However, in the collective erasing method, random access on each memory cell basis may be impossible. Specifically, in the collective erasing method, initially first writing is carried out for all memory cells in advance, followed by second writing. Therefore, the unit of data writing is the entire memory array (the unit of access for data writing is the entire memory array), and hence random access on each memory cell basis may be impossible.

In the bit-source-parallel memory array and bit-source-perpendicular memory array, processing for isolating memory elements on each one-bit cell basis is necessary.

Therefore, in order to ease the strictness of the patterning accuracy in manufacturing of memory elements to thereby improve the manufacturing yield of the memory elements, a technique has been proposed in which the ion feed layer for the memory elements is not patterned into individual layers for each memory cell but is provided in common to all the memory cells (refer to e.g. Japanese Patent Application No. 2004-214603, which will be referred to as a third patent document).

SUMMARY OF THE INVENTION

However, if this technique in which the ion feed layer for the memory elements is not patterned into individual layers for each memory cell but is provided in common to all the memory cells is employed, i.e., if a memory device is configured so that a common potential is applied to all the source lines, it is difficult to drive the memory elements in the memory device at a high speed.

Specifically, in the source line drive method, VDD needs to be applied to the selected source line when data 1 is written. Applying VDD to all the source lines leads to increased consumption current and difficulty in high-speed driving of the memory elements compared with application of VDD to a single source line.

In the collective erasing method, VDD needs to be applied to the selected source line at the time of the first writing or second writing. Specifically, when initially data 0 is written to all the memory cells and then data 1 is written in accordance with input data, VDD needs to be applied to the selected source line in the second writing. In contrast, when initially data 1 is written to all the memory cells and then data 0 is written in accordance with input data, VDD needs to be applied to the selected source line in the first writing. Applying VDD to all the source lines leads to increased consumption current and difficulty in high-speed driving of the memory elements compared with application of VDD to a single source line.

As the form of the memory array disclosed in the third patent document, any of the bit-source-parallel memory array and bit-source-perpendicular memory array is available. Furthermore, as the method for writing for the memory array, any of the source line drive method, the intermediate potential settlement method, and the collective erasing method is available. However, it would be said that, in order to decrease the size of memory cells and ensure a sufficient difference between the potentials to the selected bit and source lines for achievement of ensured writing, there is a need to employ the form of the bit-source-perpendicular memory array and the source line drive method or collective erasing method. Therefore, the following description is based on an assumption that the bit-source-perpendicular form is employed as the form of a memory array and the source line drive method or collective erasing method is employed as the writing method.

The present invention is created in consideration of the above-described respects, and provides a memory device that is allowed to secure the easiness of its manufacturing process and be driven at a high speed.

According to an embodiment of the invention, there is provided a memory device including a plurality of memory cells that each includes a memory element having a memory layer and first and second electrodes that sandwich the memory layer. The state of the memory layer is changed from a high resistance state to a low resistance state due to application of an electric signal equal to or larger than a first threshold signal between the first and second electrodes. The state of the memory layer is changed from a low resistance state to a high resistance state due to application of an electric signal equal to or larger than a second threshold signal between the first and second electrodes. The polarity of the second threshold signal is opposite to the polarity of the first threshold signal. The plurality of memory cells are divided into memory blocks of m columns by n rows (m and n are each an integer of not less than 1, $m+n \geq 3$). The memory elements in the same memory block have the first electrode that is formed of a single layer in common to the memory elements. The memory device also includes a voltage application unit that applies any voltage to the first electrode of the memory block.

Since the first electrode of the memory elements in the same memory block is formed of a single layer in common to the memory elements, there is no need to, in manufacturing of the memory elements, implement local patterning processing or the like on each memory cell basis for the first electrode formed in common to the memory elements. Therefore, the strictness of the patterning accuracy is eased, which allows the patterning to be carried out easily.

The reason why memory blocks of m columns by n rows are provided is because use of a single memory block results in the same configuration as that of the memory array described in the third patent document, and hence fails to achieve high-speed driving.

According to the above-described memory device of the embodiment of the invention, patterning can be carried out easily in manufacturing of memory elements, and the high-speed driving of the memory elements can be achieved.

DETAILED DESCRIPTION OF THE PREFERRED EMBODIMENTS

Embodiments of the present invention will be described below with reference to the accompanying drawings for comprehension of the scope of the invention.

In the description of the embodiments, 256-bit memory arrays including memory cells of vertical 16 bits by horizontal 16 bits are used as examples.

Figure 1:
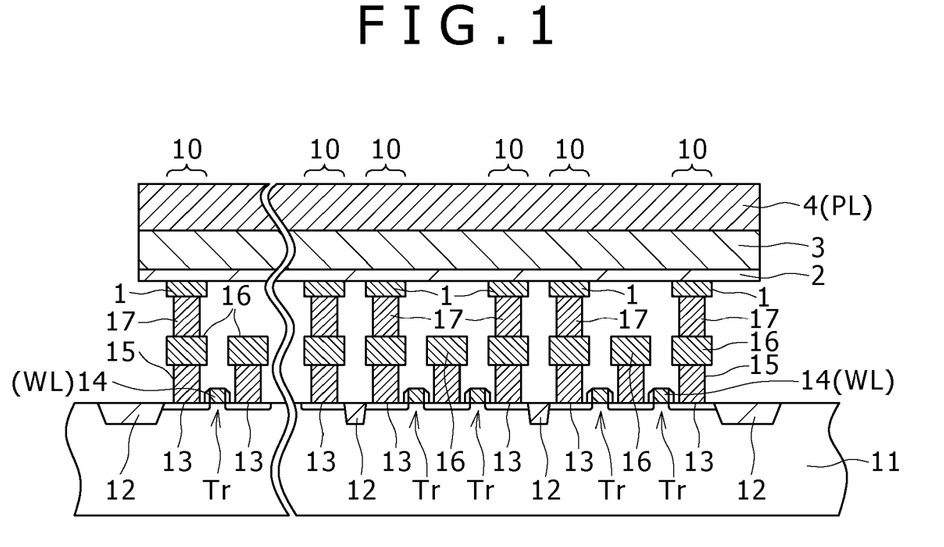
FIG. 1 is a schematic sectional view for explaining one example of a memory device to which an embodiment of the present invention is applied.

FIG. 1 is a schematic sectional view for explaining one example of a memory device to which an embodiment of the invention is applied. The memory device shown in the drawing includes memory elements 10 that are arranged in a matrix and each construct a memory cell. In each memory element, a high resistance film 2 and an ion source layer 3 are sandwiched between a lower electrode 1 and an upper electrode 4, and the high resistance film and ion source layer construct a memory layer for storing information.

The ion source layer 3 contains at least one element (metal element) selected from Ag, Cu and Zn, and at least one element (chalcogen element) selected from S, Se, and Te. The ionization of the metal element leads to a change of the resistance of the memory element. That is, the metal element (Ag, Cu, Zn) serves as the ion source.

The high resistance film 2 is composed of a material having a resistivity higher than that of the ion source layer, such as an insulator or semiconductor. Specifically, any of the following materials can be used: silicon oxides, silicon nitrides, rare-earth oxide films, rare-earth nitride films, amorphous silicon, amorphous germanium, and amorphous chalcogenides.

As the above-described ion source layer, specifically, e.g. a CuTeGeGd film can be used. The resistivity of the CuTeGeGd film differs depending on its composition. However, since Cu, Te and Gd are metal elements, the CuTeGeGd film is easier to offer a low resistance, at least compared with a film including S or Se as a chalcogen.

Of the amorphous chalcogenide thin films, a GeTe film has a greatly low resistivity of about $1 \times 10^4$ $\Omega$cm. On the contrary, e.g. the resistivity of GeSe is about $11 \times 10^{13}$ $\Omega$cm, and that of GeSTe is about $1 \times 10^{11}$ $\Omega$cm (refer to Kinou Zairyou, Japanese magazine, 'functional material' in English, Issue No. 1990, May, p. 76).

In this manner, by mixing any of metals such as Cu and Gd into a material that includes GeTe as its matrix or a material containing Te, a film with a low resistance can be obtained. The resistance of a CuTeGeGd film having a thickness of 20 nm and a cell area of 0.4 $\mu m^2$ can be set to a value lower than about 100$\Omega$.

In contrast, the resistance of a gadolinium oxide film used as the high resistance film 2 is so high that the resistance of the film 2 can easily be set higher than 100 k$\Omega$, and to even 1 M$\Omega$, even when the thickness thereof is comparatively small.

In the configuration of FIG. 1, each memory element is formed above a MOS transistor Tr formed on a semiconductor substrate 11.

The MOS transistor Tr is formed of source/drain regions 13 and a gate electrode 14 that are formed on a region isolated by element isolation layers 12 in the semiconductor substrate 11. A sidewall insulating layer is formed on the side face of the gate electrode 14.

The gate electrode 14 serves also as a word line WL, which is one address line of the memory device.

One of the source/drain regions 13 of the MOS transistor Tr is electrically coupled to the lower electrode of the memory element via a plug layer 15, a metal interconnect layer 16 and a plug layer 17.

The other of the source/drain regions 13 of the MOS transistor Tr is coupled to the metal interconnect layer 16 via the plug layer 15. The metal interconnect layer 16 is coupled to a bit line, which is the other address line of the memory device.

In one example of the memory device to which an embodiment of the invention is applied, unit memory blocks each including a predetermined number of memory cells are defined. The memory elements of the respective memory cells in the same memory block share a high resistance film, an ion source layer and an upper electrode. In other words, the respective memory elements in the same memory block are formed of a single high resistance film, a single ion source layer and a single upper electrode.

In contrast, the lower electrodes 1 are separately formed for each memory cell so that the respective memory cells are electrically isolated from each other. Due to the lower electrodes 1 separately formed for each memory cell, the memory elements of the memory cells are defined at the positions corresponding to the respective lower electrodes 1. Each lower electrode 1 is coupled to the corresponding selection MOS transistor Tr.

Furthermore, one end of the memory element is coupled to one of the source/drain of the MOS transistor Tr, while the other of the source/drain of the MOS transistor Tr is coupled to the bit line. The gate of the MOS transistor Tr is coupled to the word line.

In addition, the other end of the memory element is coupled to a plate electrode PL that is formed in common to the whole of one memory block. Through this plate electrode PL, the same potential is applied to the respective memory elements in the same memory block.

Specific embodiments of the invention and writing in the respective embodiments will be described below.

In the following description, when the memory elements of all the memory cells (horizontal 16 bits by vertical 16 bits) are formed of a single high resistance film, a single ion source layer and a single upper electrode, these common high resistance film, ion source layer and upper electrode are referred to as a single plate. In addition, when the memory elements of the memory cells in the same memory block are formed of a single high resistance film, a single ion source layer and a single upper electrode, these common high resistance film, ion source layer and upper electrode are referred to as a separated plate.

The bit width of data input/output is 4. Specifically, four bit lines are selected from the 16 bit lines for writing.

First Embodiment

Figure 2:
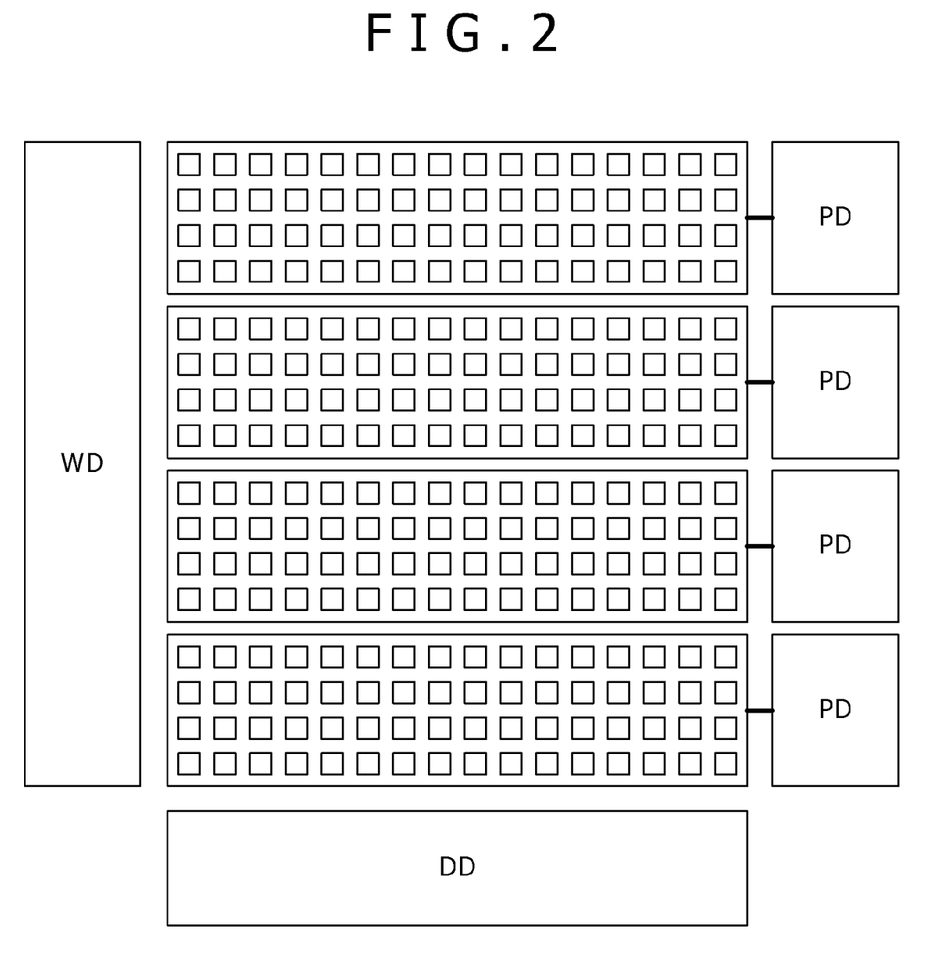
FIG. 2 is a schematic diagram for explaining a memory device according to a first embodiment of the invention.

FIG. 2 is a schematic diagram for explaining a memory device in which each unit memory block includes memory cells of horizontal 16 bits by vertical 4 bits.

In the memory device shown in the drawing, a memory array of 256 bits includes four unit memory blocks each having memory cells of horizontal 16 bits by vertical 4 bits, and the four memory blocks are arranged along the vertical direction. The memory elements of the memory cells in each unit memory block (horizontal 16 bits by vertical 4 bits) are formed of a single high resistance film, a single ion source layer and a single upper electrode. Specifically, in the first embodiment, a single plate is quadrisected along the vertical direction so that four separated plates are formed.

The word lines are connected to a word driver WD, and the bit lines are connected to a data driver DD. Each of the upper electrodes of the respective separated plates is connected to a corresponding plate driver PD. Specifically, the upper electrodes of the respective separated plates are connected to the plate drivers as a voltage application unit, so that any voltage is optionally applied from the plate drivers to the upper electrodes of the separated plates.

Writing in the memory device having the configuration shown in FIG. 2 is carried out by the same method as the source line drive method for the above-described bit-source-perpendicular memory array.

If writing is carried out by the same method as the source line drive method for the bit-source-perpendicular memory array, the separated plate can be driven at a high speed since the electric capacitance of the separated plate is smaller than that of a single plate. Therefore, high-speed writing (high-speed driving) of the memory device is achieved, and the power consumption can be reduced. However, also in the first embodiment, the problem in that VDD needs to be applied to the non-selected bit lines in writing of data 1 still remains. The number of the separated plates is determined depending on the balance between an area increase due to the separation and the degree of the need for high-speed operation with low consumption current.

Second Embodiment

Figure 3:
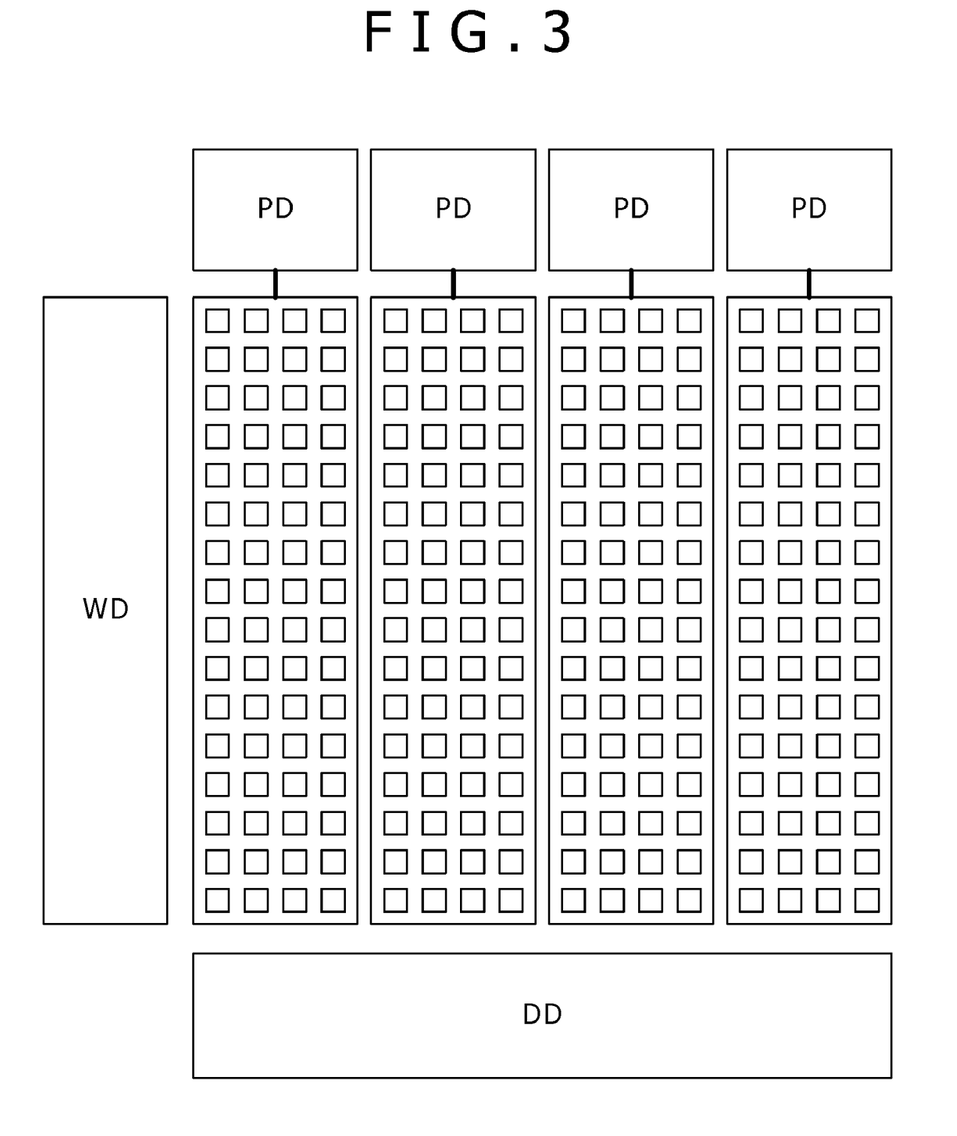
FIG. 3 is a schematic diagram for explaining a memory device according to a second embodiment of the invention.

FIG. 3 is a schematic diagram for explaining a memory device in which each unit memory block includes memory cells of horizontal 4 bits by vertical 16 bits.

In the memory device shown in the drawing, a memory array of 256 bits includes four unit memory blocks each having memory cells of horizontal 4 bits by vertical 16 bits, and the four memory blocks are arranged along the horizontal direction. The memory elements of the memory cells in each unit memory block (horizontal 4 bits by vertical 16 bits) are formed of a single high resistance film, a single ion source layer and a single upper electrode. Specifically, in the second embodiment, a single plate is quadrisected along the horizontal direction so that four separated plates are formed.

The word lines are connected to a word driver WD, and the bit lines are connected to a data driver DD. Each of the upper electrodes of the respective separated plates is connected to a corresponding plate driver PD. Specifically, the upper electrodes of the respective separated plates are connected to the plate drivers as a voltage application unit, so that any voltage is optionally applied from the plate drivers to the upper electrodes of the separated plates.

Writing in the memory device having the configuration shown in FIG. 3 is carried out by the same method as that of the first embodiment.

If writing is carried out by the same method as that for the first embodiment, the separated plate can be driven at a high speed similarly to the first embodiment since the electric capacitance of the separated plate is smaller than that of a single plate. Therefore, high-speed writing (high-speed driving) of the memory device is achieved, and the power consumption can be reduced.

If the memory device employs a single plate, there is a need to, in writing of data 1, operate the potential of non-selected bit lines in linkage with the potential applied to the single plate, in order to set the difference between the potentials to the bit lines and sources of the non-selected memory cells to 0 V. In contrast, in the second embodiment, the potential for the separated plates (non-selected separated plates) other than the separated plate (selected separated plate) including the selected memory cell does not need to be operated but can be fixed at 0 V. Therefore, in the non-selected separated plates, the potential of the non-selected bit lines can also be fixed at 0 V, and there is no need to link the bit line potential to the potential of the source, which offers low-power-consumption operation.

The number of the separated plates is determined depending on the balance between an area increase due to the separation and the degree of the need for high-speed operation with low power consumption.

Third Embodiment

Figure 4:
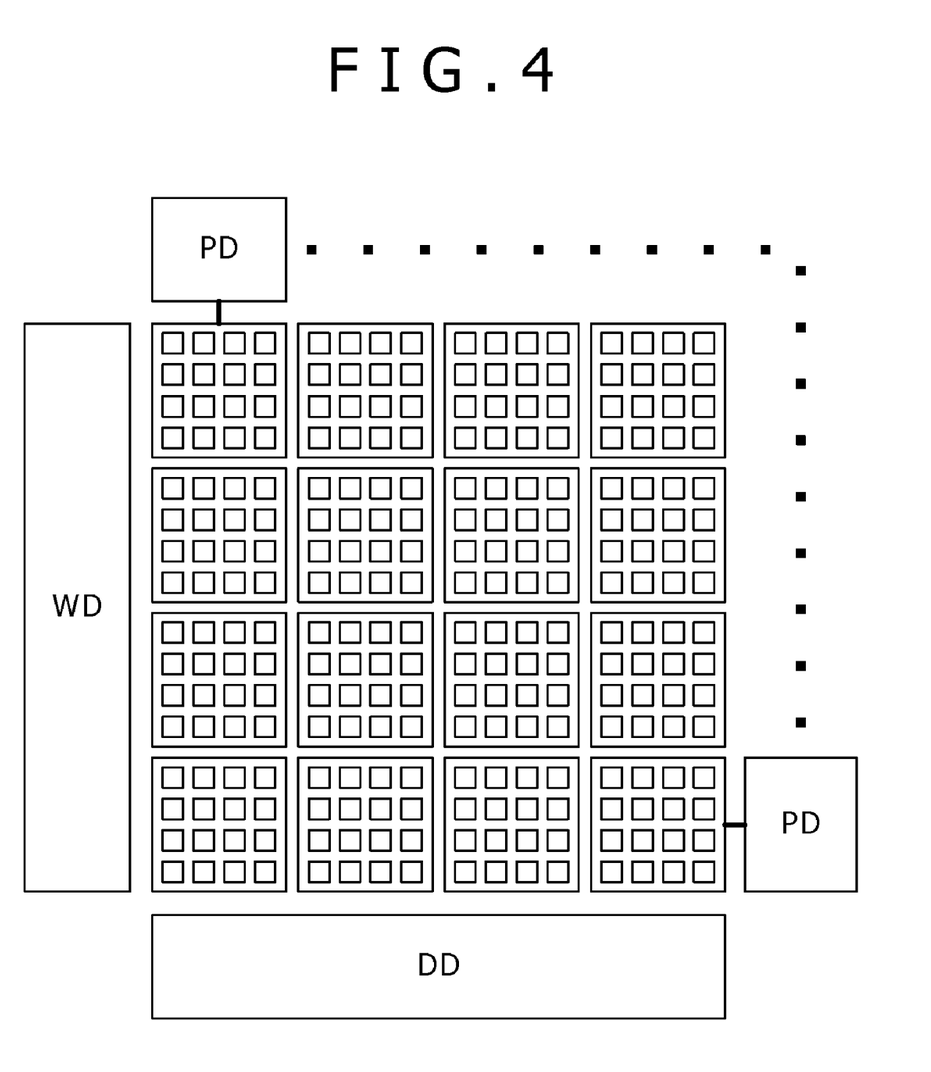
FIG. 4 is a schematic diagram for explaining a memory device according to a third embodiment of the invention.

FIG. 4 is a schematic diagram for explaining a memory device in which each unit memory block includes memory cells of horizontal 4 bits by vertical 4 bits.

In the memory device shown in the drawing, a memory array of 256 bits includes 16 (horizontal 4 by vertical 4) unit memory blocks each having memory cells of horizontal 4 bits by vertical 4 bits. The memory elements of the memory cells in each unit memory block (horizontal 4 bits by vertical 4 bits) are formed of a single high resistance film, a single ion source layer and a single upper electrode. Specifically, in the third embodiment, a single plate is quadrisected along the vertical and horizontal directions, respectively, so that 16 separated plates are formed.

The word lines are connected to a word driver WD, and the bit lines are connected to a data driver DD. Each of the upper electrodes of the respective separated plates is connected to a corresponding plate driver PD. Specifically, the upper electrodes of the respective separated plates are connected to the plate drivers as a voltage application unit, so that any voltage is optionally applied from the plate drivers to the upper electrodes of the separated plates.

Figure 5A:
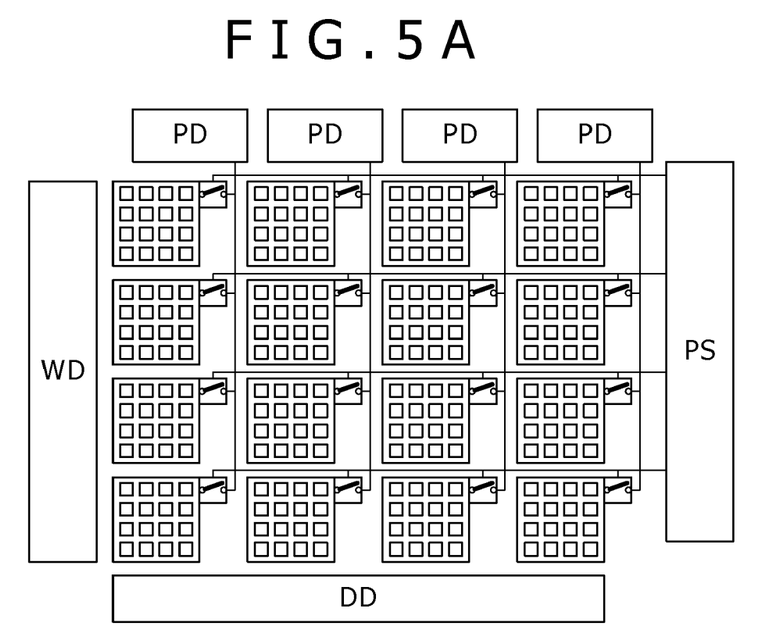
FIGS. 5A and 5B are schematic diagrams for explaining modifications of the memory device of the third embodiment.
Figure 5B:
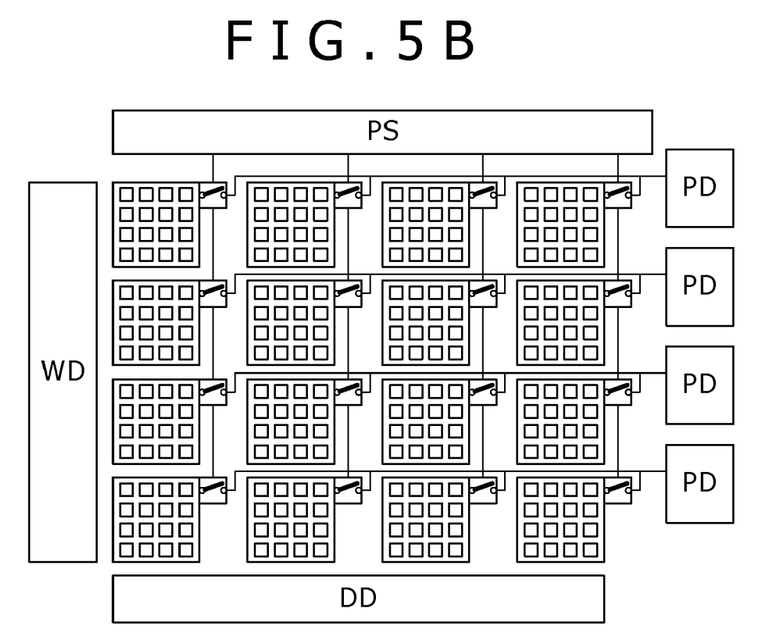

In the example of FIG. 4, 16 plate drivers (part thereof is not illustrated) are provided, and the upper electrodes of the respective separated plates and the plate drivers are in one-to-one correspondence. However, it is sufficient for the plate driver to be capable of applying a certain potential to the selected separated plate. Therefore, a configuration like one shown in FIG. 5A is available in which plate drivers PD are provided for each column and a certain potential can be applied to the separated plate selected by a plate selector PS. Alternatively, a configuration like one shown in FIG. 5B is also available in which plate drivers PD are provided for each row and a certain potential can be applied to the separated plate selected by a plate selector PS.

Also when writing is carried out in the memory device having the configuration shown in FIG. 4 by the same method as that of the first embodiment, the same advantages as those in the second embodiment can be expected.

If in the memory device with the configuration of FIG. 4, writing is carried out by the same method as the above-described collective erasing method for the bit-source-perpendicular memory array in such a manner that only the potential of the selected separated plate is varied while the potential of the non-selected separated plates is fixed, high-speed driving is achieved and hence high-speed access is allowed since the electric capacitance of the separated plate is smaller than that of a single plate.

Furthermore, in the memory device of FIG. 4, data writing is implemented on a separated plate basis (the unit of access for data writing is a separated plate). Therefore, this memory device allows a smaller access unit and hence can implement writing more finely compared with a device employing a single plate. That is, an access form that is closer to a random access form can be achieved. If the access unit is equalized to the output bit width, complete random access is allowed.

As shown in the above-described first to third embodiments, the driving speed can be enhanced by dividing a single plate to form separated plates and applying voltage to the respective separated plates independently of each other.

The above-described advantages can be achieved also by a memory device formed of a plurality of small-capacity memory devices each having one memory array and one set of peripheral circuitry, i.e., by a memory device of which entire capacity is merely shared by a plurality of small-capacity memory devices. However, the provision of the plural small-capacity memory devices results in a great increase in the device area. For that reason, the embodiments of the invention employ the division of a single plate with using the peripheral circuitry for the single plate as it is.

The areas of the following four memory devices will be calculated below: (1) a memory device of 256 bits by 256 bits (=64 kbits), (2) a memory device including four small-capacity memory devices of 16 kbits, (3) a memory device including four separated plates arising from division of a single plate into two-by-two plates, and (4) a memory device including sixty-four separated plates arising from division of a single plate into eight-by-eight plates. The calculations of the areas are based on the following conditions: the size of each memory cell is 1×1 µm; the gap between the separated plates has a gap length of 2 µm; the horizontal size of a word line driver for driving the memory array of 64 kbits is 50 µm (the horizontal size of a word line driver for driving the small-capacity memory array is 45 µm); and the vertical size of a data input/output circuit for driving the memory array of 64 kbits is 80 µm (the vertical size of a data input/output circuit for driving the small-capacity memory array is 70 µm).

(1) Memory Device of 64 kbits (The vertical size of the 64-kbit memory device)=
(the vertical size of the memory array of the
64-kbit memory device)+(the vertical size of
the data input/output circuit)=256 µm+80
µm=336 µm.

(The horizontal size of the 64-kbit memory device)=
(the horizontal size of the memory array of the
64-kbit memory device)+(the horizontal size of
the word line driver)=256 µm+50 µm=306 µm.

Consequently, the area of the 64-kbit memory device is 102816 µm².

(2) Memory Device Including Four Small-Capacity Memory Devices of 16 kbits.

(The vertical size of the 16-kbit memory device)=
(the vertical size of the memory array of the
16-kbit memory device)+(the vertical size of
the data input/output circuit)=128 µm+70
µm=198 µm.

(The horizontal size of the 16-kbit memory device)=
(the horizontal size of the memory array of the
16-kbit memory device)+(the horizontal size of
the word line driver)=128 µm+45 µm=173 µm.

Consequently, the area of the 16-kbit memory device is 34254 µm², and therefore the total area of four 16-kbit memory devices is 137016 µm². This area corresponds to an increase by about 33% of the area of the 64-kbit memory device.

This area increase is because, even when the vertical and horizontal sizes of the memory array are halved, the size decrease of the peripheral circuitry for the resulting memory array is slight.

(3) Memory Device Including Four Separated Plates Arising from Division of a Single Plate into Two-by-Two Plates (The vertical size of the memory device including
four separated plates)=(the vertical size of the
memory array)+(the gap between the separated
plates)+(the vertical size of the data input/output circuit)=256 µm+2 µm+80 µm=338 µm.

(The horizontal size of the memory device including
four separated plates)=(the horizontal size of
the memory array)+(the gap between the separated plates)+(the horizontal size of the word
line driver)=256 µm+2 µm+50 µm=308 µm.

Consequently, the area of the memory device including four separated plates due to division of a single plate into two-by-two plates is 104104 µm². This area corresponds to an increase by only about 1% of the area of the 64-kbit memory device.

(4) Memory Device Including Sixty-Four Separated Plates Arising from Division of a Single Plate into Eight-by-Eight Plates (The vertical size of the memory device including
sixty-four separated plates)=(the vertical size of
the memory array)+(the gaps between the separated plates)+(the vertical size of the data input/
output circuit)=256 µm+14 µm+80 µm=350 µm.

(The horizontal size of the memory device including
sixty-four separated plates)=(the horizontal size
of the memory array)+(the gaps between the
separated plates)+(the horizontal size of the
word line driver)=256 µm+14 µm+50 µm=320
µm.

Consequently, the area of the memory device including sixty-four separated plates arising from division of a single plate into eight-by-eight plates is 112000 µm². This area corresponds to an increase by about 9% of the area of the 64-kbit memory device.

In view of the above-described specific examples (1) to (4), the area increase of a memory device can be suppressed more effectively by dividing a single plate with using the peripheral circuitry for the single plate as it is.

What is claimed is:

1. A memory device comprising:
a plurality of memory cells that each include a memory element having a memory layer and first and second electrodes that sandwich the memory layer, the memory layer having a high resistance layer and an ion source layer, a state of the memory layer being changed from a high resistance state to a low resistance state due to application of an electric signal equal to or larger than a first threshold signal between the first and second electrodes, the state of the memory layer being changed from a low resistance state to a high resistance state due to application of an electric signal equal to or larger than a second threshold signal between the first and second electrodes, a polarity of the second threshold signal being opposite to a polarity of the first threshold signal, the plurality of memory cells being divided into memory blocks of m columns by n rows (m and n are each an integer of not less than 1, m+n≧3), the memory cells in the same memory block having first electrodes formed of a single layer in common to the memory cells of that memory block; and
voltage application means that applies any voltage to the first electrode of the memory block.

2. The memory device according to claim 1, wherein the voltage application means applies the voltage to the memory block on the same row or on the same column.

3. The memory device according to claim 1, wherein the voltage application means applies the voltage on each memory block basis.

4. The memory device according to claim 1, further comprising:
selection means that are provided for each memory block, wherein the voltage application means applies the voltage to the memory block selected by the selection means.

* * * * *